(12) United States Patent
Xue

(10) Patent No.: US 10,209,467 B2
(45) Date of Patent: Feb. 19, 2019

(54) ACTIVE OPTICAL ADAPTER PLATE AND OPTICAL INTERCONNECTION MODULE

(71) Applicant: National Center for Advanced Packaging Co., Ltd., Wuxi (CN)

(72) Inventor: Haiyun Xue, Wuxi (CN)

(73) Assignee: National Center for Advanced Packaging Co., Ltd., Wuxi (CN)

( * ) Notice: Subject to any disclaimer, the term of this patent is extended or adjusted under 35 U.S.C. 154(b) by 0 days.

(21) Appl. No.: 15/854,585

(22) Filed: Dec. 26, 2017

(65) Prior Publication Data

US 2018/0136421 A1 May 17, 2018

Related U.S. Application Data

(63) Continuation of application No. PCT/CN2016/111262, filed on Dec. 21, 2016.

(30) Foreign Application Priority Data

Dec. 21, 2015 (CN) .......................... 2015 1 0969335

(51) Int. Cl.
*G02B 6/42* (2006.01)
*H01L 21/027* (2006.01)
*H01L 31/108* (2006.01)

(52) U.S. Cl.
CPC ......... *G02B 6/4286* (2013.01); *G02B 6/4214* (2013.01); *G02B 6/428* (2013.01); *G02B 6/4249* (2013.01); *G02B 6/4292* (2013.01); *H01L 21/0274* (2013.01); *H01L 31/1085* (2013.01)

(58) Field of Classification Search
CPC . G02B 6/4286; G02B 6/4214; G02B 6/29385
USPC ................................ 385/31, 39, 48, 88, 89
See application file for complete search history.

(56) References Cited

U.S. PATENT DOCUMENTS

| | | | | |
|---|---|---|---|---|
| 5,191,204 A * | 3/1993 | Dickson | ................ | G11B 7/127 250/208.2 |
| 5,600,621 A * | 2/1997 | Noda | ..................... | G11B 7/123 369/116 |
| 5,774,486 A * | 6/1998 | Jiang | ....................... | G02B 6/42 372/31 |
| 5,812,581 A * | 9/1998 | Cox | ...................... | H01S 5/0264 372/109 |
| 6,111,903 A * | 8/2000 | Isaksson | ................ | G11B 7/126 372/33 |
| 6,314,323 B1 * | 11/2001 | Ekwall | ............... | A61N 1/36564 600/513 |
| 6,526,076 B2 * | 2/2003 | Cham | ................. | G02B 6/4204 369/112.04 |

(Continued)

*Primary Examiner* — Robert Tavlykaev
(74) *Attorney, Agent, or Firm* — Flener IP & Business Law, LLC; Zareefa B. Flener

(57) ABSTRACT

An active optical adapter plate comprises a main body, the main body comprises at least a through hole and at least a photoelectric detection area, the through hole is disposed on an end face of the main body and configured to insert an optical fiber to provide an optical path for an emission light of a laser; the photoelectric detection area is disposed on the end face of the main body having the through hole, and comprises a photoelectric detector used for detecting a reflected light of the emission light of the laser and converting the detected reflected light into an electrical signal.

20 Claims, 6 Drawing Sheets

(56) References Cited

U.S. PATENT DOCUMENTS

| | | | |
|---|---|---|---|
| 6,600,845 B1* | 7/2003 | Feldman | G02B 6/4204 385/14 |
| 6,674,709 B1* | 1/2004 | Asada | G11B 7/1263 369/112.01 |
| 6,898,219 B2* | 5/2005 | Malone | G02B 6/4212 372/101 |
| 7,286,581 B2* | 10/2007 | Coleman | H01L 31/167 257/E31.108 |
| 7,324,575 B2* | 1/2008 | Chen | G02B 17/0856 372/101 |
| 7,393,145 B1* | 7/2008 | Stevens | G02B 6/4246 250/227.15 |
| 7,457,343 B2* | 11/2008 | Vancoille | G02B 5/001 372/103 |
| 7,654,750 B2* | 2/2010 | Brenner | G02B 6/4246 385/89 |
| 8,000,358 B2* | 8/2011 | Wang | H01S 5/4025 372/29.011 |
| 9,423,581 B2* | 8/2016 | Feng | G02B 6/4286 |
| 2003/0174959 A1* | 9/2003 | Morris, Jr. | G02B 6/26 385/48 |
| 2005/0012113 A1* | 1/2005 | Sheu | H01L 31/03046 257/184 |
| 2012/0002284 A1* | 1/2012 | McColloch | G02B 6/4206 359/558 |
| 2015/0086220 A1* | 3/2015 | Warren | H04B 10/503 398/200 |

\* cited by examiner

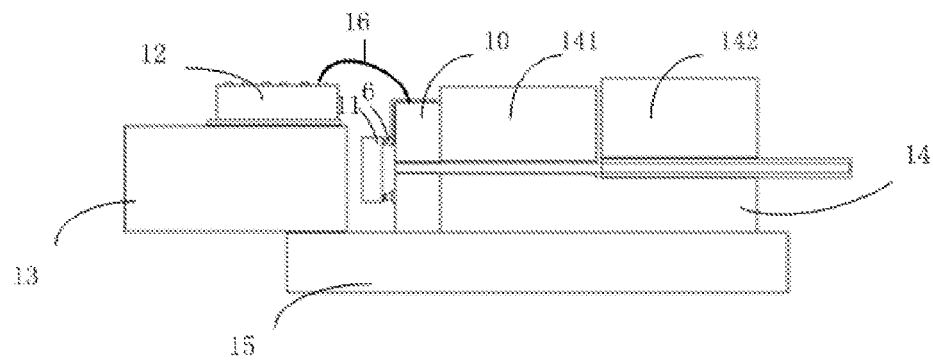
FIG. 7
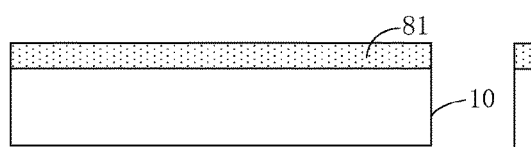
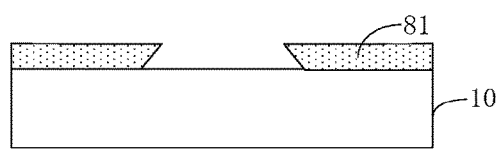
FIG. 8a        FIG. 8b
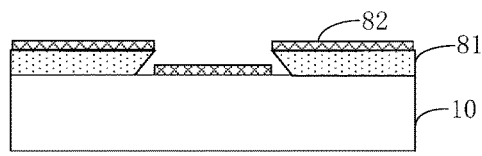
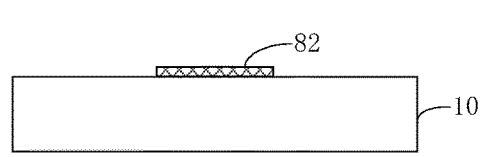
FIG. 8c        FIG. 8d
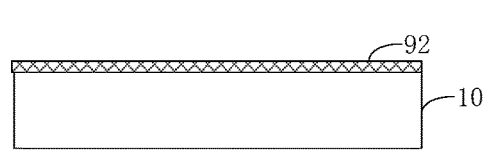
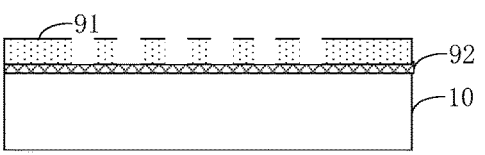
FIG. 9a        FIG. 9b
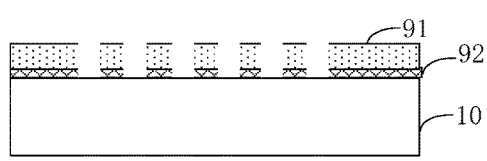
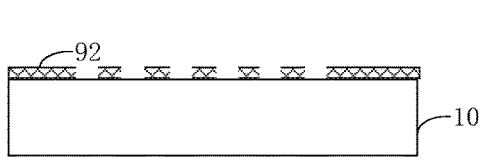
FIG. 9c        FIG. 9d

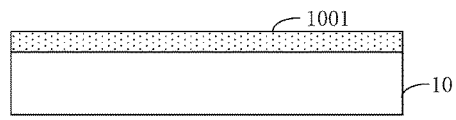
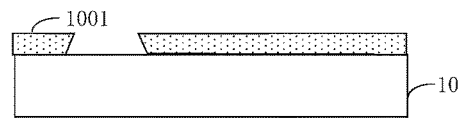
FIG. 10a    FIG. 10b
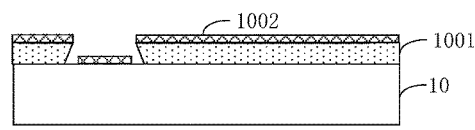
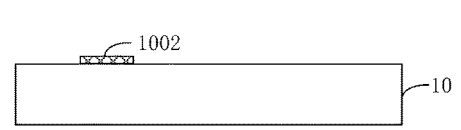
FIG. 10c    FIG. 10d
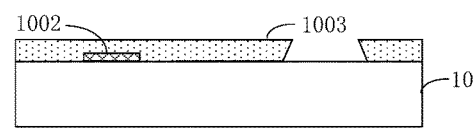
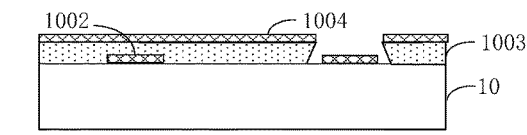
FIG. 10e    FIG. 10f
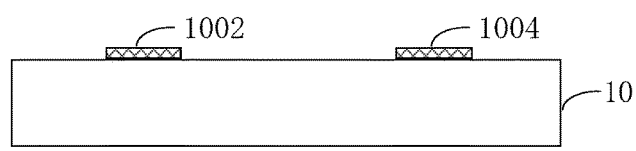
FIG. 10g
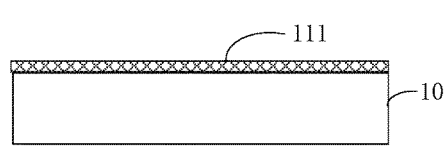
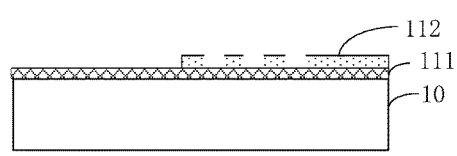
FIG. 11a    FIG. 11b
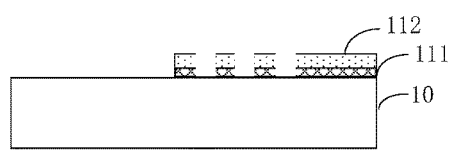
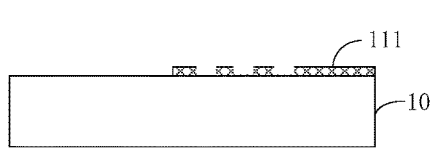
FIG. 11c    FIG. 11d

US 10,209,467 B2

ACTIVE OPTICAL ADAPTER PLATE AND OPTICAL INTERCONNECTION MODULE

CROSS-REFERENCE TO RELATED APPLICATIONS

The present application is a continuation of International Patent Application No. PCT/CN2016/111262 filed on Dec. 21, 2016, which claims priority to Chinese Patent Application No. 201510969335.9 filed on Dec. 21, 2015, all contents of which are incorporated by reference herein.

TECHNICAL FIELD

Embodiments of the present invention relate to the field of transmission technology, and more particularly to an active optical adapter plate and an optical interconnection module having the active optical adapter plate.

BACKGROUND

Data centers and server rooms require a large number of optical interconnection transmission products used for a short or medium distance (less than 300 m), for instance pluggable optical modules such as Active Optical Cables (AOCs) and Quad Small Form-factor Pluggable (QSFP) Modules. The core components of these products include lasers, laser drivers, detectors and detector post-amplifier chips. However, during usage of these products, once a fault occurs, it will not be able to determine where the problem appears. In particular, failure of the lasers at transmitting ends and their drive circuits will result in the distortion of the transmission signals.

SUMMARY

Aspects of the present invention are directed toward an active optical adapter plate, and additional aspects of the present invention are directed toward an optical interconnection module having the active optical adapter plate.

According to aspects of the present invention, an active optical adapter plate includes a main body, the main body comprises at least a through hole and at least a photoelectric detection area, the through hole is disposed on an end face of the main body and configured to insert an optical fiber to provide an optical path for an emission light of a laser; the photoelectric detection area is disposed on the end face of the main body having the through hole, and comprises a photoelectric detector used for detecting a reflected light of the emission light of the laser and converting the detected reflected light into an electrical signal.

In one embodiment, the main body further comprises first pads, configured to extract and transmit electrical signal generated by the photoelectric detection area; and rewiring layers, disposed on the end face of the main body having the through hole; wherein the first pads are electrically connected with the photoelectric detection area through the rewiring layers.

In another embodiment, the main body further comprises: second pads, configured to connect the active optical adapter plate to peripheral printed circuit boards; and bumps, which are disposed on the end face of the main body having the through hole, configured to electrically connect to the laser; wherein the second pads are electrically connected with the bumps through the rewiring layers.

According to additional aspects of the present invention, an optical interconnection module having the active optical adapter plate further includes: a laser, a laser driver chip, wherein a light-emitting unit of the laser is optically aligned with the through hole of the active optical adapter plate, a laser chip of the laser is electrically connected with the active optical adapter plate through bumps, and the active optical adapter plate is electrically connected with the laser driver chip through second pads.

In one embodiment, the optical interconnection module further includes a detector, a detector amplifier chip, a detection unit of the detector is optically aligned with the through hole of the active optical adapter plate, the detector is electrically connected with the active optical adapter plate through the bumps, and the active optical adapter plate is electrically connected with the detector amplifier chip through the second pads.

In another embodiment, the optical interconnection module further includes a printed circuit board which is electrically connected with the laser driver chip.

The active optical adapter plate and the optical interconnection module having the active optical adapter plate according to the embodiments of the present invention have an optical power monitoring function, may utilize the useless light generated by the reflection to realize real-time monitoring on the emission power of the laser without losing the useful emission power of the laser, and improve the reliability of the transmission system.

BRIEF DESCRIPTION OF DRAWINGS

The above and other aspects of the present invention will become more apparent from the following detailed description when taken in conjunction with the accompanying drawings in which:

FIG. 7 is a schematic diagram illustrating an optical interconnection module according to another embodiment of the present invention;

FIGS. 8a-8d are schematic diagrams illustrating the manufacturing processes of a photoelectric detection area of an active optical adapter plate according to an embodiment of the present invention;

FIGS. 9a-9d are schematic diagrams illustrating the manufacturing processes of a photoelectric detection area of an active optical adapter plate according to another embodiment of the present invention;

FIGS. 10a-10g are schematic diagrams illustrating the manufacturing processes of a photoelectric detection area of an active optical adapter plate according to still another embodiment of the present invention; and FIGS. 11a-11k are schematic diagrams illustrating the manufacturing processes of a photoelectric detection area of an active optical adapter plate according to still another embodiment of the present invention.

DETAILED DESCRIPTION

In the following detailed description, embodiments will be described with reference to the accompanying drawings. However, the present invention may be embodied in various different forms, and should not be construed as being limited only to the illustrated embodiments. Rather, these embodiments are provided as examples, simply by way of illustrating the concept of the present invention to those skilled in the art. Accordingly, processes, elements, and techniques that should be apparent to those of ordinary skill in the art are not described herein.

Figure 1:
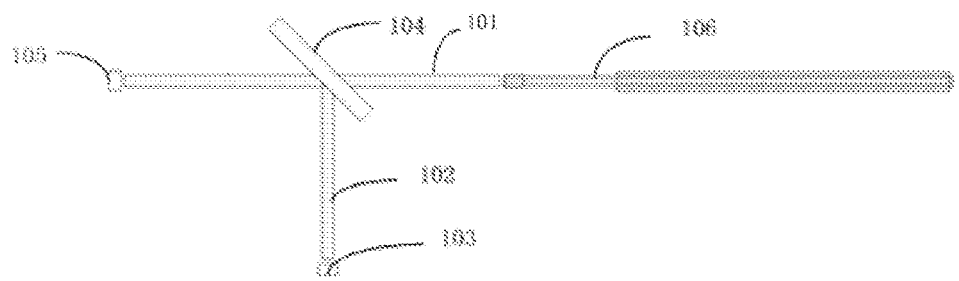
FIG. 1 is a principle diagram illustrating the laser emission power monitoring according to the prior art.

At present, the common emission power real-time monitoring is mainly implemented through setting optical path branches. As shown in FIG. 1 in which the laser emission power monitoring according to the prior art is illustrated, before the light emitted by a laser 105 is transmitted through an optical fiber 106, the optical power of the laser 105 is divided into two optical paths, one optical path 101 is configured to transmit signals, and the other optical path 102 is configured to monitor. In this method, a filter 104 for splitting light and a power monitor 103 on the monitoring optical path 102 are required, so that a part of the transmission power is sacrificed from the emission power of the laser 105 for monitoring, which increases the complexity of the circuits and reduces the power of the photoelectric conversion device which is not very high in emission power originally.

Figure 2:
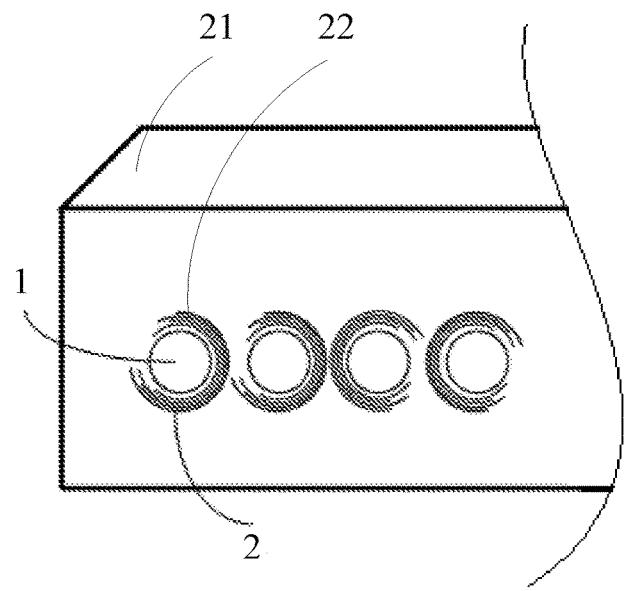
FIG. 2 is a partial schematic diagram illustrating an active optical adapter plate according to an embodiment of the present invention.

FIG. 2 is a partial schematic diagram illustrating an active optical adapter plate according to an embodiment of the present invention. As shown in FIG. 2, an active optical adapter plate according to the embodiment includes a main body 21, and the main body 21 includes at least a through hole 1 and at least a photoelectric detection area 2. The through hole 1 is disposed on an end face of the main body 21 and configured to insert an optical fiber to provide an optical path for an emission light of a laser. Preferably, in order to reduce coupling loss between the laser and the optical fiber, an exposed part of one end of the optical fiber may be inserted into the through hole 1, until an end face of the optical fiber is flush with an end face of the through hole 1. The photoelectric detection area 2, which is disposed on the end face of the main body 21 having the through hole 1, includes a photoelectric detector 22 used for detecting a reflected light of the emission light of the laser and converting the detected reflected light into an electrical signal.

When using the active optical adapter plate according to the embodiment, a reflection occurs when the laser irradiates to the entrance edge of the through hole, and the reflected light is certainly reflected to the photoelectric detection area of the active optical adapter plate after being reflected several times between a laser chip and the active optical adapter plate interface. The reflected light generates current in the area, and after the current signal is extracted and processed through a circuit, the monitoring of light emitting power of the laser may be realized through the real-time monitoring of the electrical signal.

Figure 3:
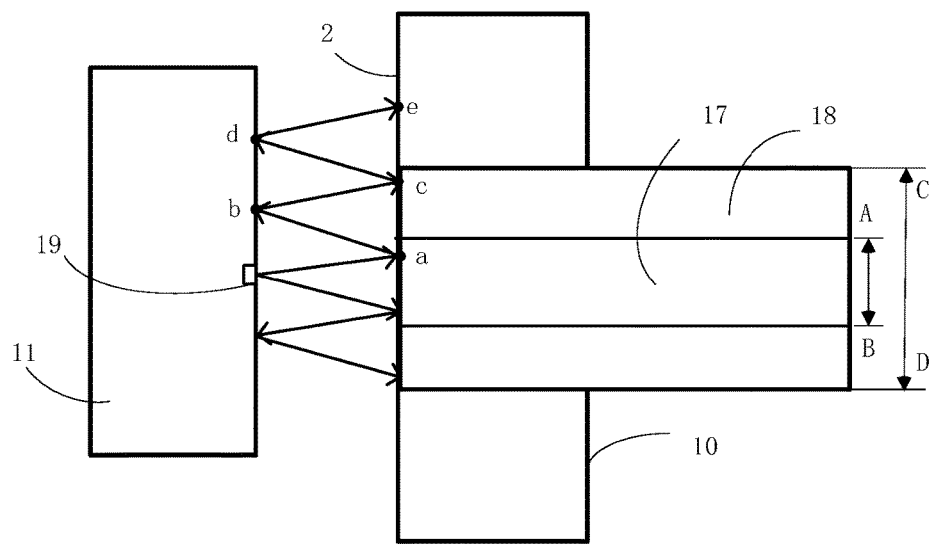
FIG. 3 is a principle diagram illustrating power monitoring implemented by an active optical adapter plate according to an embodiment of the present invention.

FIG. 3 is a principle diagram illustrating power monitoring implemented by an active optical adapter plate according to an embodiment of the present invention. It can be seen from the diagram that a light-emitting unit 19 on a laser chip 11 has a diameter of 8 μm, the diameter of a bare optical fiber 17 (the distance AB in FIG. 4) is 50 μm, and the diameter of a cladding optical fiber 18 (the distance CD in FIG. 4) is 125 μm. It is assumed that the reflection coefficient of the laser chip interface is 0.5 and the reflection coefficient of the end face of the optical fiber (ignoring the difference between the reflection coefficients of the bare optical fiber and the cladding optical fiber) is 0.04, when the distance between the laser chip 11 and the active optical adapter 10 is 70-80 μm, the light emitted by one light-emitting unit 19 of the laser chip 11 can reach the Point e of the photoelectric detection area 2 after being reflected four times. Then, the power that may be detected by the photoelectric detection area 2 may be obtained through the following calculation processes:

It is assumed that the emission power of one light-emitting unit 19 of the laser chip 11 is 1.

The light emitted by the light-emitting unit 19 is irradiated at the Point a of the bare optical fiber 17, that is, the first reflection occurs at the Point a. The optical power reflected from the Point a is 0.04×1.

The first reflected light is irradiated to the laser chip 11 and the second reflection occurs at the Point b. The optical power reflected from the Point b is 0.5×0.04×1.

The second reflected light is irradiated to the Point c of the cladding optical fiber 18, and the third reflection occurs at the Point c. The optical power reflected from the Point c is 0.04×0.5×0.04×1.

The third reflected light is irradiated again to the interface of the laser chip 11, and the fourth reflection occurs at the Point d. The optical power reflected from the Point d is $0.5 \times 0.04 \times 0.5 \times 0.04 \times 1 = 4 \times 10^{-4}$. The power is the optical power of the Point e of the photoelectric detection area 2. Through the monitoring of the voltage and/or the current generated by the photoelectric detection area 2 irradiated with the light of this part, the monitoring of the emission power of the light-emitting unit 19 of the laser chip 11 may be realized.

It can be understood that various parameters according to the embodiment are merely exemplary and may be changed or set according to the actual situation, and the implementation process of the power monitoring principle is mainly described here.

Preferably, the main body 21 comprises a plurality of through holes 1 which are disposed on the end face of the main body 21, and a plurality of photoelectric detection areas 2 which are disposed on the end face of the main body 21 and surround the plurality of through holes 1 respectively. This structure may allow the light to irradiate to the photoelectric detection area 2 through as few reflections as possible, thus ensure that the reflected light is sufficient to generate a current in the photoelectric detection area 2.

Preferably, the photoelectric detection area 2 employs a metal-semiconductor-metal (MSM) photoelectric detector structure, which utilizes photoelectric characteristics of metal-semiconductor-metal photoelectric detector (MSM-PD) and the feature that MSM-PD generates a current under light irradiation to realize the monitoring of the optical power. The metal-semiconductor-metal photoelectric detector structure employs the Schottky contact, which does not need to use the ion implantation doping process, so the manufacturing processes are stable, simple, and low in price.

It can be understood that the number of the photoelectric detection areas and the through holes according to the embodiment of the present invention is not fixed, which may be properly configured according to the number of the light-emitting units in the laser.

Figure 4:
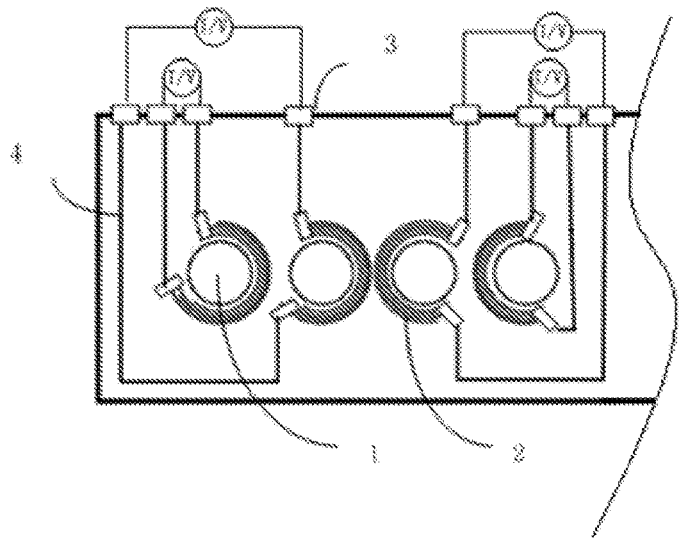
FIG. 4 is a partial schematic diagram illustrating an active optical adapter plate according to another embodiment of the present invention.

FIG. 4 is a partial schematic diagram illustrating an active optical adapter plate according to another embodiment of the present invention. It can be seen from the diagram that an active optical adapter plate according to the embodiment further includes first pads 3 and rewiring layers 4. The first pads 3 are configured to extract and transmit the electrical signals generated by the reflected lights irradiating to the photoelectric detection areas 2. In an embodiment of the present invention, the first pads 3 may be electrically connected with an electrical signal measuring device or a printed circuit board (PCB) in order to accomplish the extracting and transmitting of the electrical signals generated by the photoelectric detection areas 2, and then to realize the monitoring. The rewiring layers 4 are disposed on the end face of the main body having the through hole 1. The first pads 3 are electrically connected with the photoelectric detection areas 2 through the rewiring layers 4.

It can be understood that the number of the first pads 3 is related to the number of the photoelectric detection areas 2, two of the first pads 3 correspond to one photoelectric detection area 2, and the number of the first pads 3 shown in FIG. 4 is only exemplary, which is not limited in the present invention. According to the embodiment, loops may be established for currents generated by the reflected lights acting on the photoelectric detection areas. As long as the loop currents are monitored in real time, the real-time monitoring of the optical powers reflected to the photoelectric detection areas may be achieved.

Figure 5:
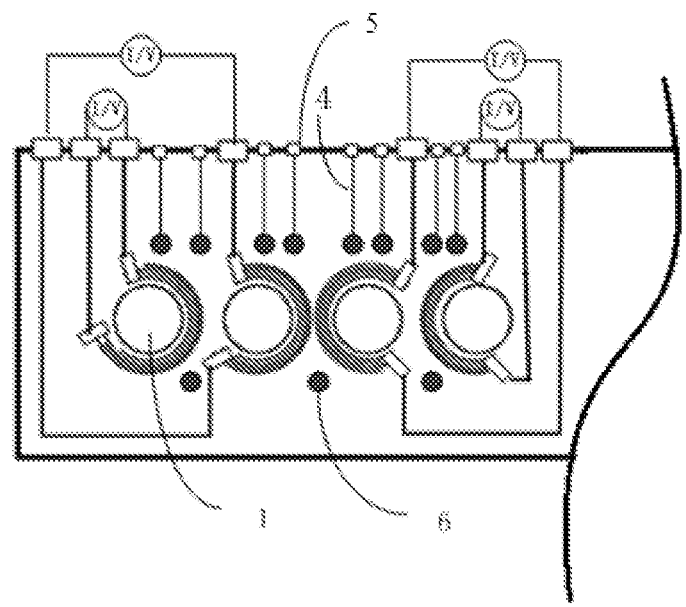
FIG. 5 is a partial schematic diagram illustrating an active optical adapter plate according to still another embodiment of the present invention.

FIG. 5 is a partial schematic diagram illustrating an active optical adapter plate according to still another embodiment of the present invention. It can be seen from the diagram that an active optical adapter plate according to the embodiment further includes second pads 5 and bumps 6. The second pads 5 are configured to connect the active optical adapter plate to peripheral printed circuit boards. In an embodiment of the invention, the first pads 3 and the second pads 5 are disposed on a side of the main body in a row, the side is perpendicular to the end face of the main body having the through holes 1.

The bumps 6 are disposed on the end face of the main body having the through holes 1, which are configured to connect to the laser chip. The second pads 5 are electrically connected with the bumps 6 through the rewiring layers 4. According to the embodiment, the rearrangement of the output ports of the active optical adapter plate is realized, which facilitates the electrical connection with the external chip and the integration and miniaturization of the entire module.

Figure 6:
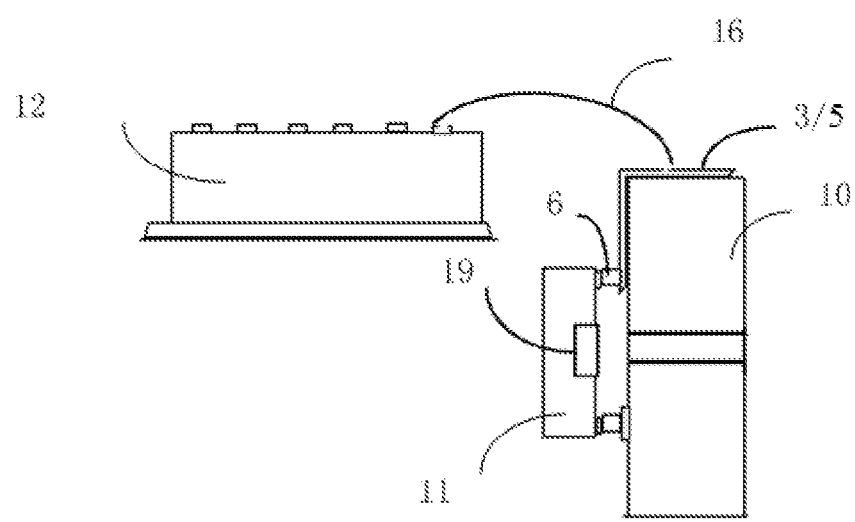
FIG. 6 is a sectional schematic diagram illustrating an optical interconnection module having the active optical adapter plate shown in FIG. 5 according to an embodiment of the present invention.

FIG. 6 is a sectional schematic diagram illustrating an optical interconnection module having the active optical adapter plate shown in FIG. 5 according to an embodiment of the present invention. The optical interconnection module according to the embodiment includes the laser chip 11, the active optical adapter plate 10 and a laser driver chip 12. Each of the light-emitting units 19 of the laser chip 11 is optically aligned with one through hole 1 of the active optical adapter plate 10, the laser chip 11 is electrically connected with the active optical adapter plate 10 through the bumps 6, and the active optical adapter plate 10 is electrically connected with the laser driver chip 12 through binding lines 16 on the second pads 5.

According to an embodiment of the present invention, based on the optical interconnection module shown in FIG. 6, an optical interconnection module may further include a detector chip and a detector amplifier chip. Each detection unit of the detector is optically aligned with one through hole of the active optical adapter plate, the detector is electrically connected with the active optical adapter plate through the bumps, and the active optical adapter plate is electrically connected with the detector amplifier chip through the second pads.

It can be understood that the laser chip and the detector chip may be disposed on an active optical adapter plate at the same time. In this case, no photoelectric detection area may be provided around the through hole corresponding to the detector chip.

In a preferred embodiment of the present invention, the laser chip 11 is a Vertical Cavity Surface Emitting Laser (VCSEL), and the detector chip is a pin type or an Avalanche Photodiode (APD). It can be understood that the laser chip and the detector chip here are only exemplary, which are not limited in the present invention.

The optical interconnection module according to an embodiment of the present invention may further include a V-shaped groove block, which is configured to fix the optical fiber. The V-shaped groove block includes two parts, the front part of the V-shaped groove block is configured to fix the bare part of the optical fiber, and the rear part of the V-shaped groove block is configured to fix the coated part of the optical fiber. This segmented design may improve the reliability of the bare optical fiber fixing.

The optical interconnection module according to an embodiment of the present invention may further include a PCB, one end of the PCB is electrically connected with a communication device, and the other end of the PCB is electrically connected with the laser driver chip/the detector amplifier chip. In this way, multi-module integration can be achieved.

FIG. 7 is a schematic diagram illustrating an optical interconnection module according to another embodiment of the present invention. It can be seen from the diagram that an optical interconnection module according to the embodiment includes a base 15, the laser chip 11, the active optical adapter plate 10, a V-shaped groove block 14, the laser driver chip 12 and a PCB 13. The V-shaped groove block 14 includes multiple V-groove shaped channels, and each channel includes a front part 141 for fixing a bare optical fiber and a rear part 142 for fixing a coated optical fiber. The base 15 is configured to dissipate heat and fix components. The active optical adapter plate 10 is horizontally fixed on the base 15, and the opening direction of the array type through holes in the active optical adapter plate 10 is parallel with the plane of the base 15. The laser chip 11 is connected to one side of the active optical adapter plate 10 through the bumps 6. Each through hole of the array type through holes in the active optical adapter plate 10 corresponds to one channel of the V-shaped groove block 14, and the external bottom surface of the V-shaped groove block 14 and the bottom surface of the active optical adapter plate 10 are fixed on the base 15. The PCB 13 is fixed on one side of the base 15 close to the active optical adapter plate 10. The laser driver chip 12 is electrically connected with the PCB 13 and disposed above the PCB 13, and is electrically connected with the active optical adapter plate 10 through the binding lines 16.

In the optical interconnection module according to the present embodiment, when the light emitted by the laser reaches the end face of the optical fiber, a part of the useless reflected light is generated, which is reflected alternately between the end face of the laser and the end face of the active optical adapter plate, until the energy is exhausted. However, when the reflected light is irradiated to the photoelectric detection area after several times of reflection, the voltage and/or the current generated by the useless reflected light irradiated to the photoelectric detection area may be monitored, so that the emission power monitoring of the optical interconnection module may be achieved.

In other words, emission power of the laser is certain under normal work, optical power reflected to the photoelectric detection area after some certain times of reflection is also certain, so the voltage and current generated by the photoelectric detection area under the action of the reflected light are also certain, and voltage and current of the photoelectric detection area can be measured. When the measured voltage and/or current of the photoelectric detection area changes or even disappears, it can be concluded that the optical interconnection module has a fault on the transmitting end, so as to realize the emission power monitoring.

The specific manufacturing processes of the photoelectric detection area 2 in the above-mentioned active optical adapter plate 10 will be described below through several embodiments.

FIGS. 8a-8d are schematic diagrams illustrating manufacturing processes of a photoelectric detection area of an active optical adapter plate according to an embodiment of the present invention. The photoelectric detection area of the active optical adapter plate 10 employs a metal-semiconductor-metal photoelectric detector structure, and two metal electrodes in the metal-semiconductor-metal photoelectric detector structure are identical (for instance, both are Au/Ti electrodes). The specific manufacturing processes employ the lift-off method, including the following steps.

As shown in FIG. 8a, a photoresist layer 81 is spin coated on a surface of the active optical adapter plate 10 for manufacturing the photoelectric detection area.

The spin coating process parameters of the photoresist layer 81 may follow the parameter specification of the selected photoresist, for example, the thickness of the photoresist layer 81 may be 1-2 μm, however, it is not limited in the present invention.

Take a negative photoresist as an example, as shown in FIG. 8b, the photoresist layer 81 is exposed and developed.

A bimetallic electrode pattern is formed by an exposed part of the active optical adapter plate 10 after being developed. During the developing process, the exposed part of photoresist layer 81 remains on the active optical adapter plate 10, and the rest unexposed part is dissolved to expose the surface of the active optical adapter plate 10.

In an embodiment of the present invention, before the photoresist layer 81 is exposed, in order to enhance the adhesion of the photoresist and release the stress inside the photoresist layer 81, the photoresist layer 81 may also be soft baked. After the photoresist layer 81 is developed, in order to completely evaporate off the residual developer and further improve the adhesion of the photoresist, the photoresist layer 81 and the exposed part of the active optical adapter plate 10 after being developed may also be baked, chamfered, dried and microscopically examined. In an embodiment of the invention, the photoresist layer 81 may be formed in an inverted-cone shape in order to be peeled off easily in subsequent processes.

It can be understood, in order to improve the processing quality of the exposing and developing, the above-mentioned operations such as soft baking, baking, chamfering, drying and microscopic examination may also be implemented in other processes mentioned in subsequent embodiments of the invention, and repeated description will be omitted in the subsequent embodiments of the invention to avoid redundancy.

As shown in FIG. 8c, a metal electrode layer 82 is manufactured on the surface of the photoresist layer 81 and the exposed surface of the active optical adapter plate 10.

When both of the metal electrodes are Au/Ti electrodes, it is necessary to prepare a Ti electrode layer and then prepare an Au metal layer. The Au metal layer is used for forming an electrical connection with external metal wires and therefore it needs to have a sufficient thickness (for instance, when the thickness of the Ti electrode layer is 30 nm, the Au metal layer needs a thickness of 100-200 nm).

In an embodiment of the present invention, the metal electrode layer 82 may be prepared by the directional sputtering or the electron beam thermal evaporation process, and further one or more of operations such as rinsing, drying and monitoring need to be performed to ensure the quality of the metal electrode layer 82.

As shown in FIG. 8d, the photoresist layer 81 is peeled off.

Since the exposed part of the active optical adapter plate 10 after being developed forms the bimetallic electrode pattern, after the residual photoresist layer 81 is peeled off, the remaining metal electrode layer 82 on the active optical adapter plate 10 forms a bimetallic electrode.

In an embodiment of the present invention, in order to ensure the photoresist layer 81 is completely peeled off, the surface of the active optical adapter plate 10 can be further rinsed and dried.

FIGS. 9a-9d are schematic diagrams illustrating manufacturing processes of a photoelectric detection area of an active optical adapter plate according to another embodiment of the present invention. The photoelectric detection area of the active optical adapter plate 10 also adopts a metal-semiconductor-metal photoelectric detector structure, and the two metal electrodes of the metal-semiconductor-metal photoelectric detector structure are also identical (for instance, both are Ti electrodes). But unlike the manufacturing processes provided in FIGS. 8a-8d, the manufacturing processes shown in FIGS. 9a-9d adopt the wet etching method, including the following steps.

As shown in FIG. 9a, a metal electrode layer 92 is manufactured on the surface of the active optical adapter plate 10 for manufacturing the photoelectric detection area.

Specifically, the metal electrode layer 92 may be manufactured by directly sputtering on an undefined pattern substrate, and the thickness of the metal electrode layer 92 may be 200 nm. The formed metal electrode layer 92 may also be annealed. In an embodiment of the present invention, the metal electrode layer 92 may be annealed at 150-250° C. for 30 minutes under nitrogen or vacuum conditions. It should be noted that when the metal electrode layer 92 is a Ti metal layer, the thickness of the Ti metal layer needs to be effectively controlled, because the Ti metal layer will produce a greater internal stress and easy to fall off when the Ti metal layer is thicker than 50 nm.

As shown in FIG. 9b, a photoresist layer 91 is spin coated on a surface of the metal electrode layer 92, and then the photoresist layer 91 is exposed and developed.

The remaining part of the photoresist layer 91 after being developed forms a bimetallic electrode pattern. In an embodiment, in order to improve the adhesion of the photoresist layer 91, an adhesion promoter may also be spin coated on the surface of the metal electrode layer 92 before the photoresist layer 91 is spin coated.

As shown in FIG. 9c, the exposed part of the metal electrode layer 92 after being developed is etched away.

In an embodiment, the metal electrode layer 92 is a Ti metal layer, and the proportion of etching solution used for etching the Ti metal layer may be 30% $H_2O_2$:49% HF:$H_2O$=1:1:20. The etching rate may be 880 nm/min, and the etching temperature may be 20° C. When needed to stop etching, a large amount of water is added, and then the Ti metal layer is washed with ultra-pure water and dried.

As shown in FIG. 9d, the photoresist layer 91 is peeled off.

Since the residual part of the photoresist layer 91 after being developed forms the bimetallic electrode pattern, the metal electrode layer 92 under the residual part of the photoresist layer 91 is not be etched away, so a bimetallic electrode is formed on the active optical adapter plate 10 after the remaining photoresist layer 91 is peeled off. Then the Au metal layer may be directly manufactured on the bimetal electrode through the lift-off process in order to form an electrical connection with the external metal wires.

FIGS. 10a-10g are schematic diagrams illustrating manufacturing processes of a photoelectric detection area of an active optical adapter plate according to still another embodiment of the present invention. The two metal electrodes of the metal-semiconductor-metal photoelectric detector structure used in the active optical adapter plate 10 are mutually different (for instance, the two electrodes may be an Au/Ti electrode and an Au/Ni electrode, respectively). In this way, the photoelectric detection area 2 can be provided with a lower dark current so as to improve the accuracy of the photoelectric detection area 2 in the optical power monitoring.

The specific manufacturing processes may still adopt the lift-off method. However, due to the two metal electrodes to be manufactured are different, therefore, a first metal electrode 1002 needs to be manufactured through the lift-off process first, and then a second metal electrode 1004 is manufactured on the active optical adapter plate 10 having the first metal electrode 1002 through the lift-off process again. The manufacturing processes of the photoelectric detection area 2 will be described below referring to FIGS. 10a-10g.

As shown in FIG. 10a, a first photoresist layer 1001 is spin coated on the surface of the active optical adapter plate 10 used for manufacturing the photoelectric detection area.

As shown in FIG. 10b, the first photoresist layer 1001 is exposed and developed.

The exposed part of the active optical adapter plate 10 after being developed forms a first metal electrode pattern.

As shown in FIG. 10c, a first metal electrode layer 1002 is manufactured on a surface of the first photoresist layer 1001 and an exposed surface of the active optical adapter plate 10.

When the first metal electrode is an Au/Ti electrode, the Ti electrode layer needs to be manufactured first, and then the Au metal layer is manufactured.

As shown in FIG. 10d, the first photoresist layer 1001 is peeled off, and then a second photoresist layer 1003 is spin coated on the surface of the active optical adapter plate 10.

After the first photoresist layer 1001 is peeled off, the first metal electrode 1002 is first formed on the active optical adapter plate 10, and then the second photoresist layer 1003 is spin coated on the surface of the active optical adapter plate 10 having the first metal electrode 1002 in order to manufacture the second metal electrode 1004.

As shown in FIG. 10e, the second photoresist layer 1003 is exposed and developed.

The exposed part of the active optical adapter plate 10 after being developed forms a second metal electrode pattern.

As shown in FIG. 10f, the second metal electrode layer 1004 is manufactured on a surface of the second photoresist layer 1003 and an exposed surface of the active optical adapter plate 10.

When the second metal electrode 1004 is an Au/Ni electrode, the Ni electrode layer needs to be manufactured first, and then the Au metal layer is manufactured.

As shown in FIG. 10g, the second photoresist layer 1003 id peeled off.

After the second photoresist layer 1003 is peeled off, the second metal electrode 1004 is formed on the active optical adapter plate 10 having the first metal electrode 1002.

FIGS. 11a-11k are schematic diagrams illustrating manufacturing processes of a photoelectric detection area of an active optical adapter plate according to still another embodiment of the present invention. The two metal electrodes of the metal-semiconductor-metal photoelectric detector structure used in the active optical adapter plate 10 are also mutually different, and they are manufactured by the wet etching method unlike used in FIGS. 9a~9d, due to the two metal electrodes (described as a third metal electrode and a fourth metal electrode in the present embodiment) to be manufactured are different. The manufacturing processes shown in FIGS. 11a-11k need the wet etching process to be implemented three times, including the following steps.

As shown in FIG. 11a, a third metal electrode layer 111 is manufactured on the surface of the active optical adapter plate 10 used for manufacturing the photoelectric detection area.

The method that directly sputtering on an undefined pattern substrate may be used in the specific manufacturing processes. When the third metal electrode layer 111 is a Ni metal layer, the thickness of the Ni metal layer may be 30 nm.

As shown in FIG. 11b, a third photoresist layer 112 spin coated on a surface of the third metal electrode layer 111, and then the third photoresist layer 112 is exposed and developed.

The residual part of the third photoresist layer 112 after being developed constitutes a third metal electrode pattern.

As shown in FIG. 11c, the exposed part of the third metal electrode layer 111 after being developed is etched away.

In an embodiment, the third metal electrode layer 111 is a Ni metal layer, and the etching solution for etching the Ni metal layer may be 30% $FeCl_3$. The etching rate may be 1.25 μm/min, and the etching temperature may be 40° C. When needed to stop etching, a large amount of water is added, and then the Ni metal layer is washed with ultra-pure water and dried.

Figure 11E:
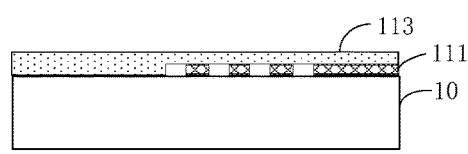

As shown in FIGS. 11d-11e, the third photoresist layer 112 is peeled off, and then a fourth photoresist layer 113 is spin coated on the surface of the active optical adapter plate 10.

Specifically, after the third photoresist layer 112 is peeled off, the remaining part of the third metal electrode layer 111 on the active optical adapter plate 10 forms the third metal electrode, and then the fourth photoresist layer 113 is spin coated on the surface of the active optical adapter plate 10 having the third metal electrode in order to prevent the third metal electrode 111 from being etched in subsequent processes.

Figure 11F:
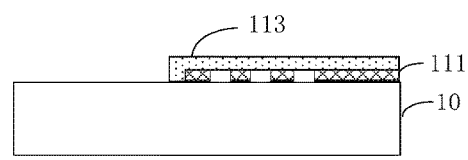

As shown in FIG. 11f, the fourth photoresist layer 113 is exposed and developed.

The residual part of the fourth photoresist layer 113 after being developed covers the third metal electrode layer 111.

Figure 11G:
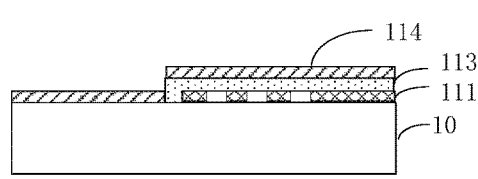

As shown in FIG. 11g, a fourth metal electrode layer 114 is manufactured on an exposed surface of the active optical adapter plate 10 and a surface of the residual fourth photoresist layer 113.

Figure 11H:
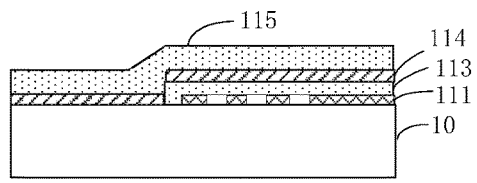

As shown in FIG. 11h, a fifth photoresist layer 115 is spin coated on a surface of the fourth metal electrode layer 114.

Figure 11I:
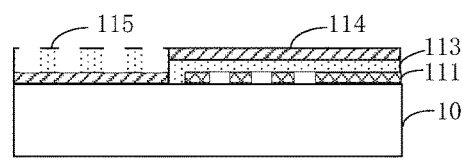
Figure 11J:
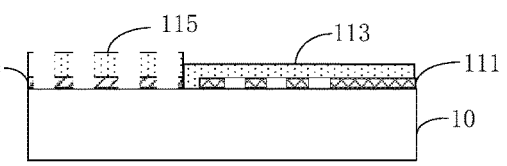

As shown in FIGS. 11i-11j, the fifth photoresist layer 115 is exposed and developed. The residual part of the fifth photoresist layer 115 after being developed constitutes a fourth metal electrode pattern, and then the exposed part of the fourth metal electrode layer 114 after being developed is etched away.

Specifically, after the fifth photoresist layer 115 is developed, except that the gap of the remaining fifth photoresist layer 115 exposes the fourth metal electrode layer 114, the fourth metal electrode layer 114 on the surface of the fourth photoresist layer 113 is also exposed. After all the exposed fourth metal electrode layer 114 is etched, the fourth metal electrode layer 114 under the remaining fifth photoresist layer 115 forms the fourth metal electrode. In an embodiment, the fourth metal electrode layer 114 is a Ti metal layer, and the proportion of etching solution used for etching the Ti metal layer may be 30% $H_2O_2$:49% $HF:H_2O$=1:1:20. The etching rate may be 880 nm/min, and the etching temperature may be 20° C. When needed to stop etching, a large amount of water is added, and then the Ti metal layer is washed with ultra-pure water and dried.

Figure 11K:
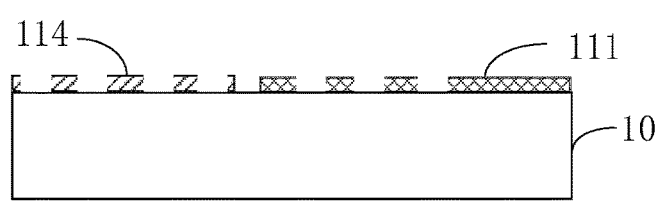

As shown in FIG. 11k, the fourth photoresist layer 113 and the fifth photoresist layer 115 are peeled off.

After the fourth photoresist layer 113 and the fifth photoresist layer 115 are peeled off, the third metal electrode 111 and the fourth metal electrode 114 form on the active optical adapter plate 10. Afterwards, the Au metal layer may be directly manufactured on the bimetallic electrode through the lift-off process to form the electrical connection between the third metal electrode 111 and the fourth metal electrode 114 with the external metal wires, separately.

In an embodiment of the present invention, when a metal-semiconductor-metal photoelectric detection structure is to be manufactured by the lift-off method, before the metal-semiconductor-metal photoelectric detection structure is manufactured, one or more of preprocesses are also needed for the surface of the active optical adapter plate 10, and the preprocesses include low concentration doping Si, removing the oxide layer, washing with ultra-pure water, spin drying, dehydration drying and spin coating with an adhesion promoter.

when a metal-semiconductor-metal photoelectric detection structure is to be manufactured by the wet etching method, before the metal-semiconductor-metal photoelectric detection structure is manufactured, one or more of preprocesses are also needed for the surface of the active optical adapter plate 10, and the preprocesses include low concentration doping Si, removing the oxide layer, washing with ultra-pure water, spin drying, dehydration drying and Ar microwave plasma in situ sputtering cleaning.

The above process of removing the oxide layer may be specifically implemented as follows: employing a hydrofluoric acid buffer solution to conduct the etching treatment on the surface of low-concentration doped Si. The ratio of the hydrofluoric acid buffer solution may be 6NH4F:1HF, and the etching rate under the ratio may be 100-250 nm/min. However, it may be understood that the specific etching rate may be determined according to the density of $SiO_2$ covering the surface of low-concentration doped Si, which is not limited in the present.

The dehydration drying process may be specifically implemented as follows: drying at 150-300° C. under pure nitrogen or vacuum for 30-60 minutes, cooling in nitrogen, and then putting the active optical adapter plate 10 in a nitrogen box for storage and calculation. The adhesion promoter may be Hexamethyldisilazane (HMDS).

While the present disclosure has been described with reference to exemplary embodiments, it will be apparent to those skilled in the art that various changes and modifications may be made without departing from the spirit and scope of the present invention. Therefore, the above embodiments are provided for illustrative purposes only, and should not in any sense be interpreted as limiting the scope of the present disclosure.

What is claimed is:

1. An active optical adapter plate, comprising a main body, wherein the main body comprises at least a through hole and at least a photoelectric detection area surrounding the at least through hole, the through hole penetrates an end face of the main body and is configured to receive an optical fiber to provide an optical path for an emission light of a laser; the photoelectric detection area is disposed on the end face of the main body having the through hole, and comprises a photoelectric detector used for detecting a reflected portion of the emission light of the laser converting the detected reflected portion into an electrical signal, the reflected portion originating at an end face of the optical fiber.

2. The active optical adapter plate of claim 1, wherein the main body comprises a plurality of through holes which penetrate the end face of the main body, and a plurality of photoelectric detection areas which are disposed on the end face of the main body and surround the plurality of through holes respectively.

3. The active optical adapter plate of claim 1, wherein the main body further comprises:
    first pads, configured to extract and transmit electrical signal generated by the photoelectric detection area; and
    rewiring layers, disposed on the end face of the main body having the through hole;
    wherein the first pads are electrically connected with the photoelectric detection area through the rewiring layers.

4. The active optical adapter plate of claim 3, wherein the main body further comprises:
    second pads, configured to connect the active optical adapter plate to peripheral printed circuit boards; and
    bumps, which are disposed on the end face of the main body having the through hole, configured to electrically connect to the laser;
    wherein the second pads are electrically connected with the bumps through the rewiring layers.

5. The active optical adapter plate of claim 4, wherein the first pads and the second pads are disposed on a side of the main body in a row, the side is perpendicular to the end face of the main body having the through hole.

6. The active optical adapter plate of claim 1, wherein the photoelectric detector is a metal-semiconductor-metal photoelectric detector.

7. The active optical adapter plate of claim 6, wherein two metal electrodes of the metal-semiconductor-metal photoelectric detector are mutually different.

8. The active optical adapter plate of claim 7, wherein manufacturing processes of the metal-semiconductor-metal photoelectric detector comprise:
    spin coating a first photoresist layer on a surface of the active optical adapter plate used for manufacturing the photoelectric detection area;
    exposing and developing the first photoresist layer;
    manufacturing a first metal electrode layer on a surface of the first photoresist layer and an exposed surface of the active optical adapter plate;

peeling off the first photoresist layer, and then spin coating a second photoresist layer on the surface of the active optical adapter plate;

exposing and developing the second photoresist layer;

manufacturing a second metal electrode layer on a surface of the second photoresist layer and an exposed surface of the active optical adapter plate; and peeling off the second photoresist layer.

9. The active optical adapter plate of claim 7, wherein manufacturing processes of the metal-semiconductor-metal photoelectric detector comprise:

manufacturing a third metal electrode layer on a surface of the active optical adapter plate used for manufacturing the photoelectric detection area;

spin coating a third photoresist layer on a surface of the third metal electrode layer, exposing and developing the third photoresist layer;

etching away an exposed part of the third metal electrode layer after developing;

peeling off the third photoresist layer, and then spin coating a fourth photoresist layer on the surface of the active optical adapter plate;

exposing and developing the fourth photoresist layer;

manufacturing a fourth metal electrode layer on an exposed surface of the active optical adapter plate and a surface of a residual part of the fourth photoresist layer;

spin coating a fifth photoresist layer on a surface of the fourth metal electrode layer;

exposing and developing the fifth photoresist layer, and etching away an exposed part of the fourth metal electrode layer after developing; and peeling off the fourth photoresist layer and the fifth photoresist layer.

10. The active optical adapter plate of claim 6, wherein two metal electrodes of the metal-semiconductor-metal photoelectric detector are identical.

11. The active optical adapter plate of claim 10, wherein manufacturing processes of the metal-semiconductor-metal photoelectric detector comprise:

spin coating a photoresist layer on a surface of the active optical adapter plate used for manufacturing the photoelectric detection area;

exposing and developing the photoresist layer;

manufacturing a metal electrode layer on a surface of the photoresist layer and an exposed surface of the active optical adapter plate; and peeling off the photoresist layer.

12. The active optical adapter plate of claim 11, wherein the metal electrode is manufactured by a directional sputtering method or an electron beam thermal evaporation process.

13. The active optical adapter plate of claim 11, wherein before exposing the photoresist layer, manufacturing processes of the metal-semiconductor-metal photoelectric detector further comprise: soft baking the photoresist layer; and/or after developing the photoresist layer, manufacturing processes of the metal-semiconductor-metal photoelectric detector further comprise:

forming the photoresist layer as an inverted-cone shape;

performing one or more of operations on the photoresist layer and the exposed part of the active optical adapter plate, wherein the operations include baking, drying and microscopic examination.

14. The active optical adapter plate of claim 11, wherein before manufacturing the metal-semiconductor-metal photoelectric detector, performing one or more of preprocesses on the surface of the active optical adapter plate, wherein the preprocesses include low concentration doping Si, removing an oxide layer, washing with ultra-pure water, spin drying, dehydration drying and spin coating with an adhesion promoter.

15. The active optical adapter plate of claim 10, wherein manufacturing processes of the metal-semiconductor-metal photoelectric detector comprise:

manufacturing a metal electrode layer on a surface of the active optical adapter plate used for manufacturing the photoelectric detection area;

spin coating a photoresist layer on a surface of the metal electrode layer, and then exposing and developing the photoresist layer;

etching away an exposed part of the metal electrode layer after developing; and peeling off the photoresist layer.

16. The active optical adapter plate of claim 15, wherein the metal electrode layer is manufactured by a method of directional sputtering on an undefined pattern substrate; and/or before spin coating the photoresist layer on a surface of the metal electrode layer, conducting annealing treatment to the metal electrode layer.

17. The active optical adapter plate of claim 15, wherein before manufacturing the metal-semiconductor-metal photoelectric detector, performing one or more of the preprocesses on the surface of the active optical adapter plate, wherein the preprocesses include low concentration doping Si, removing an oxide layer, washing with ultra-pure water, spin drying, dehydration drying and Ar microwave plasma in situ sputtering cleaning.

18. An optical interconnection module, comprising: a laser, an active optical adapter plate, a laser driver chip, wherein the active optical adapter plate comprises a main body, the main body comprises at least a through hole and at least a photoelectric detection area surrounding the at least through hole, the through hole penetrates an end face of the main body and is configured to receive an optical fiber to provide an optical path for an emission light of a laser; the photoelectric detection area is disposed on the end face of the main body having the through hole, and comprises a photoelectric detector for detecting a reflected portion of the emission light of the laser and converting the detected reflected portion into an electrical signal, the reflected portion originating at an end face of the optical fiber; and wherein a light-emitting unit of the laser is optically aligned with the through hole of the active optical adapter plate, a laser chip of the laser is electrically connected with the active optical adapter plate through bumps, and the active optical adapter plate is electrically connected with the laser driver chip through second pads.

19. The optical interconnection module of claim 18, further comprising: a detector, a detector amplifier chip, wherein a detection unit of the detector is optically aligned with the through hole of the active optical adapter plate, the detector is electrically connected with the active optical adapter plate through the bumps, and the active optical adapter plate is electrically connected with the detector amplifier chip through the second pads.

20. The optical interconnection module of claim 19, further comprising: a printed circuit board which is electrically connected with the laser driver chip.

\* \* \* \* \*